United States Patent [19]
Berg

[11] Patent Number: 4,482,937
[45] Date of Patent: Nov. 13, 1984

[54] BOARD TO BOARD INTERCONNECT STRUCTURE

[75] Inventor: William C. Berg, Stillwater, Minn.

[73] Assignee: Control Data Corporation, Minneapolis, Minn.

[21] Appl. No.: 431,894

[22] Filed: Sep. 30, 1982

[51] Int. Cl.³ .......... H05K 1/14
[52] U.S. Cl. .......... 361/413; 339/17 LM; 339/176 MP; 361/414
[58] Field of Search .......... 361/413, 414, 415; 339/17 LM, 176 MP

[56] References Cited

U.S. PATENT DOCUMENTS

| | | | |
|---|---|---|---|
| 2,699,534 | 1/1955 | Klostermann | 339/176 MP |
| 3,340,439 | 9/1967 | Henschen et al. | 361/413 |
| 3,418,533 | 12/1968 | Perotto | 317/100 |
| 3,459,998 | 8/1969 | Focarile | 317/100 |
| 3,489,954 | 1/1970 | Humphrey et al. | 317/101 |
| 3,591,834 | 12/1969 | Kolias | 317/101 CC |
| 3,652,899 | 3/1972 | Henschen | 361/412 X |
| 3,836,935 | 9/1974 | Johnson | 339/17 LM |
| 3,868,162 | 2/1975 | Ammon | 361/413 X |
| 4,133,592 | 1/1979 | Cobaugh et al. | 339/176 MP X |
| 4,232,923 | 11/1980 | Otsuki et al. | 339/17 M X |
| 4,283,755 | 11/1981 | Tracy | 361/393 |

OTHER PUBLICATIONS

Ho et al., Multiple LSI Silicon Chip Modules with Power Buses Composed of Laminated Silicon Sheets with Metallized Upper and Lower Surfaces, IBM Tech. Disc. Bull., V. 22, #8A, Jan. 1980, pp. 3410 and 3411.

*Primary Examiner*—R. R. Kucia
*Attorney, Agent, or Firm*—Edmund J. Wasp; Joseph A. Genovese

[57] ABSTRACT

A board to board interconnect assembly is installed between a first multilayer circuit board and a second multilayer circuit board. The assembly is comprised of a first housing member carrying electrical contacts and a second housing member carrying electrical contacts which mateably engage with the contacts of the first housing member. The first and second circuit boards have corresponding arrays of plated through apertures selectively connected to the circuit layers of the respective boards. Socket carrying contacts are frictionally engaged in certain of the plated through conductive apertures of the first and second circuit boards to secure the first housing member to the first circuit board and the second housing member to the second circuit board. Flex contacts are installed in conductive plated through apertures of the boards opposite each of the socket contacts and are frictionally engaged with the socket contacts. The socket and flex contacts are frictionally coupled to electrically connect the circuit layers of the first circuit board with the circuit layers of the second circuit board in a direct vertical relationship. The opposed first and second housing members support and position the contacts and serve as spacers between the circuit boards.

2 Claims, 9 Drawing Figures

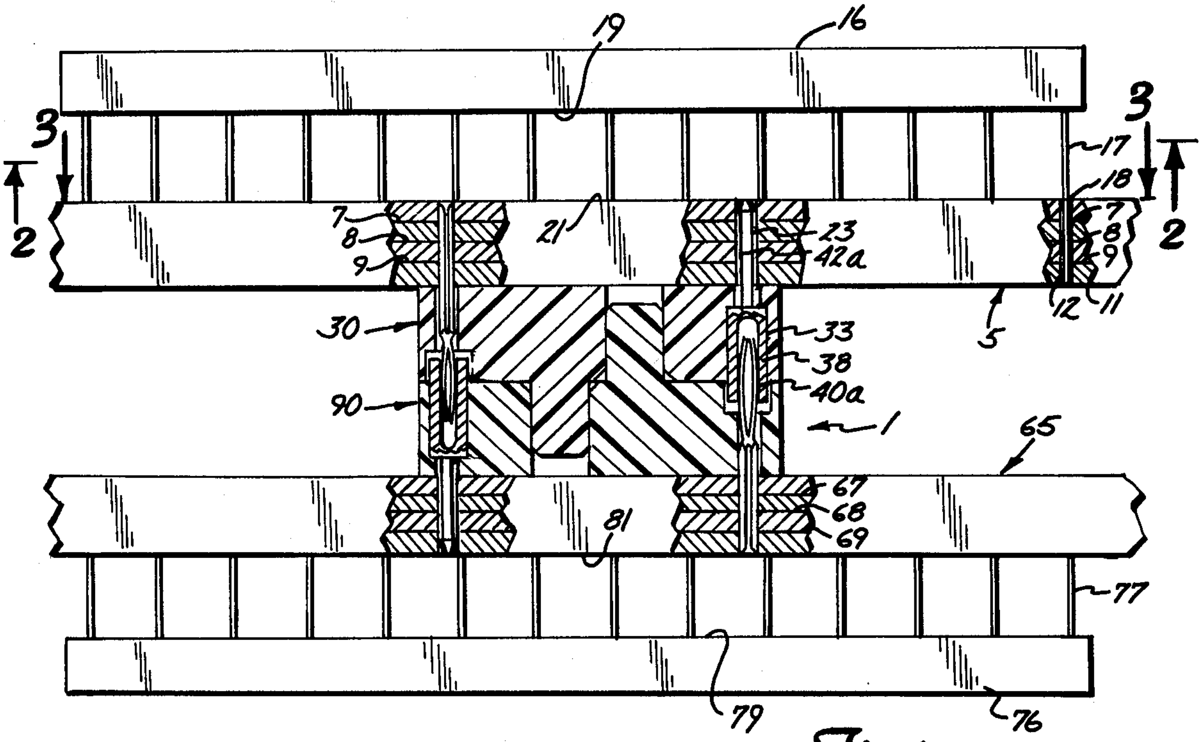
Fig.1
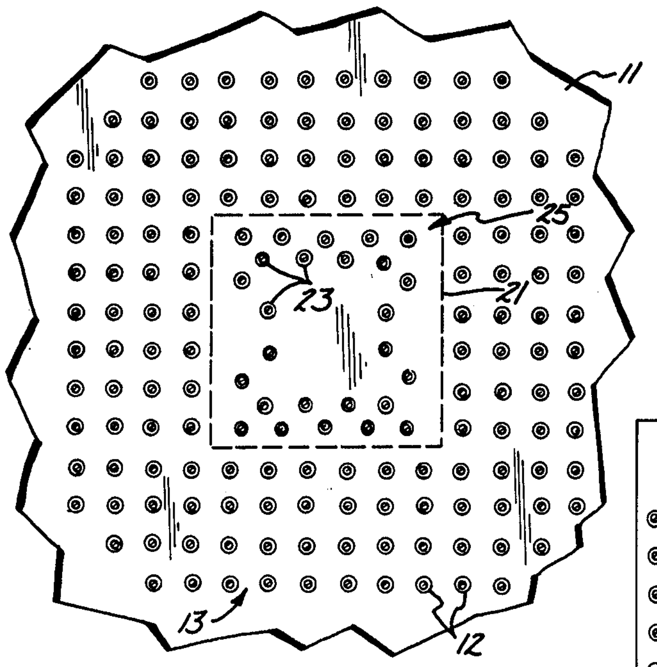
Fig.3
Fig.2
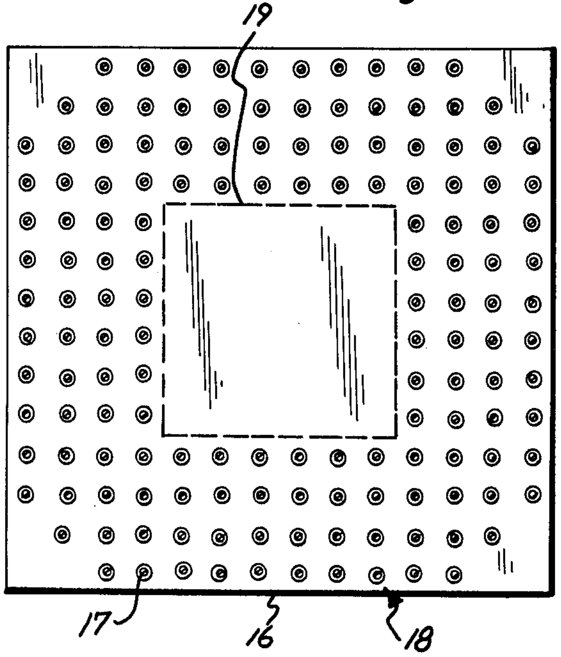

BOARD TO BOARD INTERCONNECT STRUCTURE

BACKGROUND

The present invention relates to interconnect structures for electrically connecting vertically arranged circuit boards.

Examples of prior art structures are shown in U.S. Pat. Nos. 4,283,755; 3,591,834; 3,489,954; 3,459,998 and 3,418,533.

Conventionally, in order for one board to "talk" to an adjacent overlying or underlying board, signal lines are run from the chips of the first board to the edge of the board, conductors are then provided from the edge of the first board to the edge of the second board, and signal lines then connect the conductors along the edge of the second board to the chips of the second board.

While the prior art evidences some progress in improving upon this circuitous route for board to board signal lines, none of the prior art structures discloses an interconnect structure which suitably solves the board to board interconnect problem, especially for boards carrying many chips. Moreover, in the past, the "well space" directly underlying each of the chips, and generally bounded by its pin arrangement, has been ignored as an interconnect region, wasting valuable circuit board space.

SUMMARY

The present invention therefore comprises a board to board interconnect structure which can be installed directly between the well spaces of chips mounted on vertically arranged multilayer circuit boards. The interconnect structure includes mating housing members which support and position electrical contacts projecting from the opposed boards. Each pair of opposed contacts is frictionally, but removeably, joined together at one end and has opposite ends frictionally secured to plated through apertures of the adjacent boards. The plated through apertures are selectively connected to the circuit layers of the boards. The coupled contact structure as supported by the mating housing members, thus, provides direct board to board vertical signal lines between the adjacent boards. Moreover, such an interconnect assembly can be installed between the well spaces of the chips of the opposed circuit boards, greatly reducing conductor congestion along the input/output edge region of the circuit board.

It is therefore an object of the present invention to provide an improved board to board interconnect structure.

It is a further object of the invention to provide an interconnect structure which can be installed between the well spaces of chips mounted on adjacent boards.

It is a further object to provide an interconnect structure for adjacent boards which is comprised of mating housing members secured to the boards and carrying contacts which frictionally engage one another when the housing members are assembled to provide direct vertical signal lines between the boards.

Yet another object is to provide a board to board interconnect structure which reduces conductor congestion along the input/output edge region of the circuit board.

Still another object is to provide an interconnect structure which reduces board to board signal path length to speed up the operation of the circuitry.

These and other objects, advantages and novel features of the present invention will become apparent from the following detailed description of the invention taken in conjunction with the accompanying drawings.

BRIEF DESCRIPTION OF THE DRAWINGS

FIG. 1 is a cross-sectional elevational view of the present invention showing the oppositely mounted chips 16 and 76.

FIG. 2 is a cross-sectional view taken along line 2—2 of FIG. 1 and showing the bottom of chip 16.

FIG. 3 is a cross-sectional view taken along line 3—3 of FIG. 1 and showing a portion of the top of board 5.

DESCRIPTION OF THE PREFERRED EMBODIMENT

Figure 4:
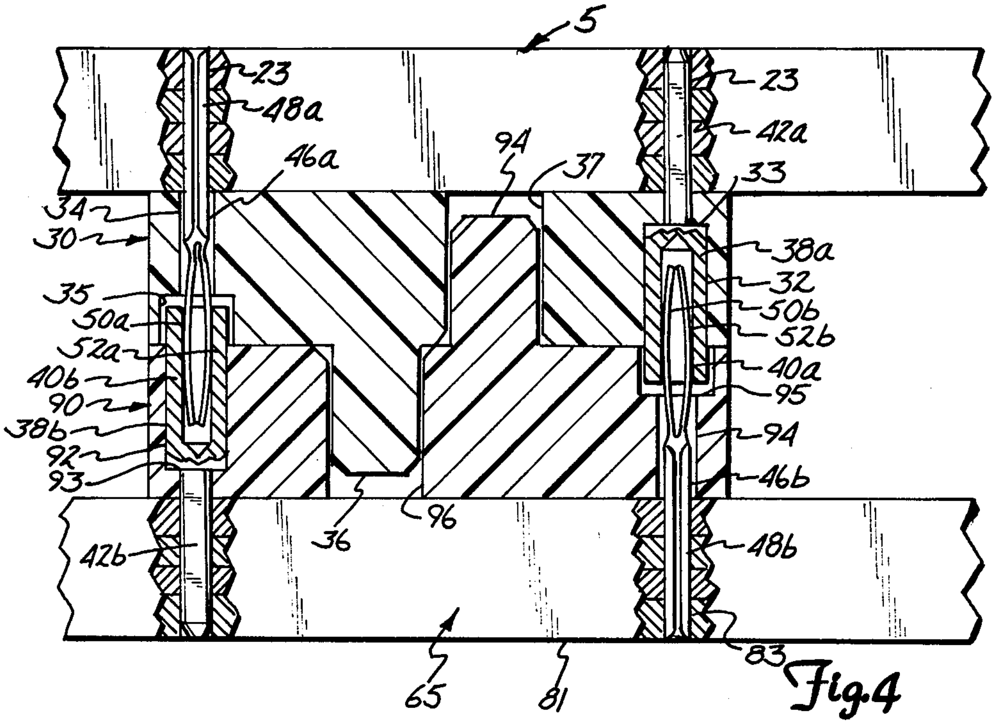
FIG. 4 is an enlarged cross-sectional elevational view of a portion of FIG. 1.

The circuit board interconnect assembly of the present invention is indicated by the numeral 1 in FIG. 1. The assembly 1 interconnects a first circuit board 5 to a second circuit board 65.

First circuit board 5 is a multilayer circuit board having circuit layers 7, 8 and 9. The board 5 supports a plurality of integrated circuit chips. A representative chip 16 is shown in FIG. 1 supported by the board 5 at an interior region 11. As shown in FIG. 2, chip 16 has a plurality of pins 17 disposed in a pin array 18 about a well space 19. The pins 17 are frictionally received at their lower ends 18 into the plated through sockets 12 which are disposed in a socket array 13 corresponding to pin array 18. See FIG. 3. The sockets 12 are selectively connected to the internal circuit layers 7, 8 and 9 of circuit board 5 in the conventional manner. With further reference to FIG. 3, circuit board 5 has a well space 21 which corresponds directly to the well space 19 of chip 16. A plurality of electrically conductive apertures 23 are formed through circuit board 5 within the well space 21. The apertures 23 are selectively connected to the circuit layers 7, 8 and 9, and are disposed in an aperture array 25. The apertures 23 are utilized to electrically connect the circuit layers 7, 8, 9 (and chips 16) of board 5 to the interconnect assembly 1 as will now be described.

Figure 5:
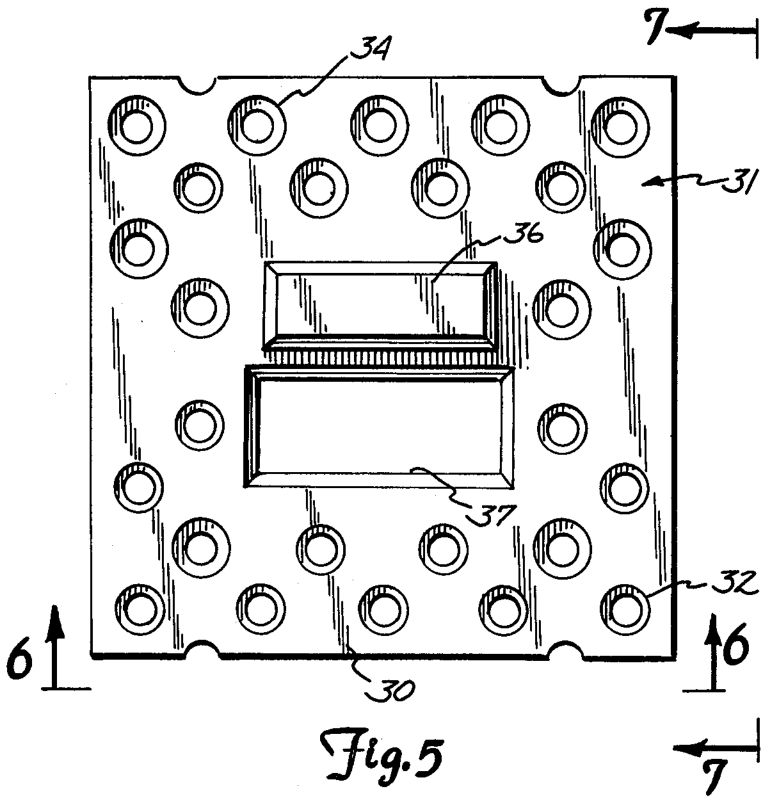
FIG. 5 is a plan view of the first housing member 30.
Figure 7:
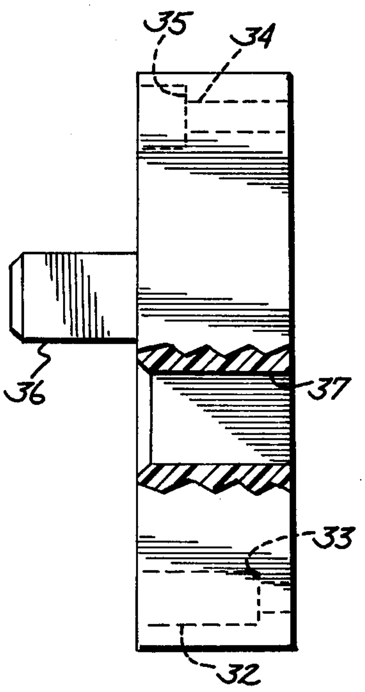
FIG. 7 is an elevational view taken along line 7—7 of FIG. 5.
Figure 6:
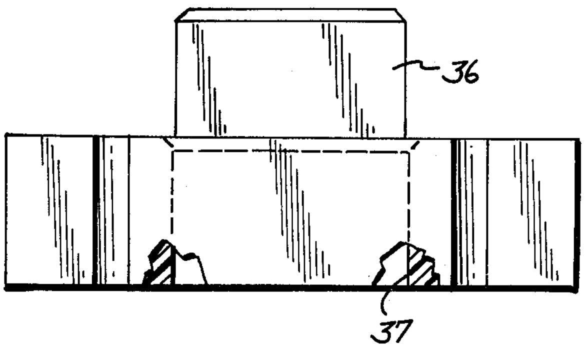
FIG. 6 is an elevational view taken along line 6—6 of FIG. 5.

With particular reference to FIG. 4, the assembly 1 is comprised of a first housing member 30 and a second housing member 90. The housing members 30 and 90 are identical, and therefore, only housing member 30 will be described in detail. Housing member 30 is best shown in FIGS. 5-7. Member 30 is a solid plastic block type structure having an array 31 of through-formed apertures 32, 34. Apertures 32 comprise socket apertures while apertures 34 comprise pin apertures. Each of the socket apertures 32 has a deep recess 33, and each of the pin apertures 34 has a shallower, but broader, recess 35. The aperture array 31 of member 30 corresponds directly to the aperture array 25 of circuit board 5 shown in FIG. 3. Each of the apertures 32 or 34 of the array 31 has a correspondingly positioned aperture 23 of the array 25. Note that there are twenty-six apertures in array 31, thirteen socket apertures 32 and thirteen pin apertures 34. Member 30 also includes a rectangular alignment projection 36 and a rectangular alignment cavity 37. The projection 36 and cavity 37 initially assist in aligning member 30 with member 90 during assembly as will later be more fully described.

Figure 8:
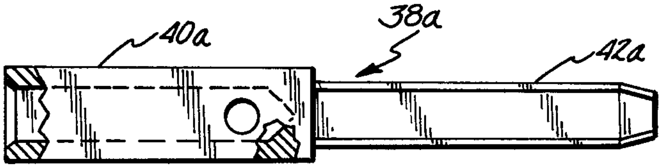
FIG. 8 is an elevational view of pin **38*a***.
Figure 9:
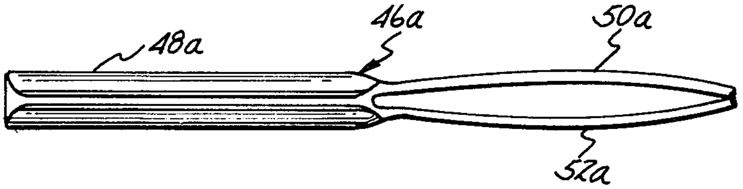
FIG. 9 is an elevational view of pin **46*a***.

Member 30 is secured to the underside of circuit board 5 by socket contacts 38*a*. See FIG. 4. As shown in FIG. 8 each of the socket contacts 38*a* has a socket end 40*a* and a pin end 42*a* opposite thereto. One of the socket contacts 38*a* is installed in each of the socket apertures 32, with the socket end 40*a* of each contact 38*a* being slideably received within the recess 33 of the aperture 32, and the pin end 42*a* being frictionally received within an aperture 23 of aperture array 25 of board 5. Each of the remaining thirteen apertures of the aperture array 31 has a flex contact 46*a* installed therein. With reference to FIG. 9, each flex contact 46*a* has a c-section 48*a* formed at one end and a pair of spring legs 50*a*, 52*a* disposed from the other end. A flex contact 46*a* is frictionally secured into each of the apertures 23 of array 25 which corresponds to a pin aperture 34 of array 31 by means of its c-section 48*a* which deflects inwardly somewhat upon insertion into the aperture 23. See FIG. 4. The oppositely disposed spring legs 50*a*, 52*a* of each of the contacts 46*a* extends through the corresponding pin aperture 34 of housing member 30.

Having described the manner in which the first housing member 30 is physically secured to circuit board 5 and electrically connected to the circuit layers 7, 8 and 9 by means of the contacts 38*a*, 46*a*, the manner in which the second housing member 90 is installed upon second circuit board 65 can easily be appreciated. Second circuit board 65 is a multilayer board like board 5 having circuit layers 67, 68, 69. A chip 76 is secured by pins 77 to the board 65. See FIG. 1. The pins 77 are selectively connected to the internal circuit layers 67, 68, 69 of board 65 in the coventional manner. Chip 76 is identical to the chip 16 in FIG. 2 and includes a well space 79 identical to well space 19 of chip 16. Circuit board 65 includes a well space 81 which corresponds directly to well space 79 and includes a array of conductive apertures 83 identical to the array 25 of board 5. Second housing member 90 is identical to member 30. Member 90 has an aperture array directly corresponding to the array of apertures 83 of board 65 and identical to the array 31 of member 30. The array is comprised of socket apertures 92 and pin apertures 94. See FIG. 4. Each of the socket apertures 92 has a deep recess 93, and each of the pin apertures 94 has a shallower, but wider, recess 95. Member 90 also includes an alignment projection 94 and an alignment cavity 96.

A socket contact 38*b*, identical to 38*a*, and having a socket end 40*b* and a pin end 42*b*, is installed in each of the thirteen socket apertures 92 to secure housing member 90 to circuit board 65. Flex contacts 46*b*, identical to contacts 46*a*, are frictionally engaged to apertures 83 of board 65 by their c-sections 48*b* and have their oppositely disposed spring legs 50*b*, 52*b* projecting through the thirteen pin apertures 94 of member 90.

With reference to FIG. 4, the assembly of housing member 30 to member 90 will now be described. As the members 30 and 90 are moved towards one and other the projection 36 of member 30 must be aligned with cavity 96 of member 90, and projection 94 of member 90 must be aligned with cavity 37 of member 30. Once this initial alignment is achieved, the thirteen pairs of spring legs 50*a*, 52*a* of each of the pin contacts 46*a* of member 30 will align with the corresponding socket ends 400*b* of the thirteen socket contacts 38*b* of member 90. Simultaneously, the thirteen pairs of spring legs 50*b*, 52*b* of the pin contacts 46*b* of member 90 will align with the corresponding socket ends 40*a* of the socket contacts 38*a* of member 30. The member 30 and 90 are then assembled together with projections 36, 94 being slideably received within the respective cavities 96, 37, and each of the spring legs 50*a*, 52*a* and 50*b*, 52*b* being deflected inwardly and frictionally received within the respective socket ends 40*b*, 40*a*. Note that in the assembly position the recesses 35, 95 of the respective pin apertures 34, 94 accommodate the terminal portions of the respective socket ends 40*b*, 40*a* of the socket pins 38*b*, 38*a*.

Having described the basic structure of the interface assembly 1, the manner in which it operates can now be appreciated. Each of the boards 5 and 65 carry a plurality of chips 16, 76 which are connected by pins 17, 77, respectively, to the internal circuit layers 7, 8, 9 and 67, 68, 69 of the boards 5, 65. An interconnect assembly 1 is secured between the respective well spaces 21 and 81 of each pair of oppositely mounted chips 16 and 76. Each interconnect assembly 1 provides twenty-six direct board-to-board electrical interconnections between board 5 and board 65. Hence the assemblies 1 directly interconnect the chips 16 of board 5 with the chips 76 of board 65 through the respective circuit layers 7, 8, 9 and 67, 68, 69 and the coupled contacts 38*a*, 46*b* and 38*b*, 46*a*.

By utilizing the direct board-to-board interconnect assembly 1 of the present invention, the signal paths between the chips 16 and chips 76 are considerably shortened, increasing the speed of operation. In addition the number of board to board input/output terminals which must be provided along the edge of the circuit board is reduced. In fact, the invention has the effect of merging together each pair of adjacent boards in a vertically arranged stack of boards so that each pair of adjacent boards appears as a single circuit board to the remainder of the system. Circuit density is therefore increased while the design of the interconnect circuitry is simplified.

As an additional advantage, the members 30, 90 when assembled together serve as spacers for the boards 30, 90 providing a definite air space between the boards 5,65. By holding the air space to a definite distance, the forced air cooling of the boards can be closely controlled.

Having described the preferred embodiment of the present invention, many modifications and variations thereof would be obvious to one skilled in that art. The invention is, therefore, intended to be limited only by the scope of the appended claims.

I claim:

1. An assembly for interconnecting a first circuit board containing circuitry to a second circuit board containing circuitry, each board having a plurality of apertures for receiving pins, said assembly comprising:

first and second housing members each having a flat surface for abutting a surface of one of said circuit boards, an alignment projection, an alignment cavity, a plurality of socket apertures and a like plurality of pin apertures, said first and second housing members being identically configured and being mutually assemblable so that when the alignment projection of one member mates with the alignment cavity of the other member the pin apertures of each member confront the socket apertures of the other member;

a socket contact supported within each socket aperture, each socket contact having an electrically conductive pin portion and an electrically conductive socket end, the pin portion of each socket contact extending beyond the flat surface of the respective housing member and being frictionally engagable to a respective aperture of one said circuit boards; and a pin contact supported within each pin aperture, each pin contact having an electrically conductive pin portion and an electrically conductive flex contact, the pin portion of each pin contact extending beyond the flat surface of the respective housing member and being frictionally engagable to a respective aperture of one of said circuit boards, each flex contact being frictionally engagable to a respective socket end of a socket contact when said first and second housing members are mated;

whereby identically configured housing members supporting socket contacts and pin contacts may be mutually engagable to interconnect said first and second circuit boards.

2. An assembly according to claim 1 wherein each of said flex contacts comprises a pair of oppositely mounted spring legs which deflect inwardly upon insertion into the socket end of one of said socket contacts.

* * * * *